(12) United States Patent
Yen et al.

(10) Patent No.: US 10,622,966 B2
(45) Date of Patent: Apr. 14, 2020

(54) BULK ACOUSTIC WAVE RESONATORS HAVING A PHONONIC CRYSTAL ACOUSTIC MIRROR

(71) Applicant: Texas Instruments Incorporated, Dallas, TX (US)

(72) Inventors: Ting-Ta Yen, San Jose, CA (US); Bichoy Bahr, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 303 days.

(21) Appl. No.: 15/660,550

(22) Filed: Jul. 26, 2017

(65) Prior Publication Data

US 2019/0036512 A1   Jan. 31, 2019

(51) Int. Cl.
  *H03H 9/17*   (2006.01)
  *H03H 9/05*   (2006.01)
  *H03H 9/02*   (2006.01)

(52) U.S. Cl.
  CPC ........ *H03H 9/177* (2013.01); *H03H 9/02118* (2013.01); *H03H 9/0533* (2013.01); *H03H 9/171* (2013.01); *H03H 9/175* (2013.01)

(58) Field of Classification Search
  CPC .............................. H03H 9/171; H03H 9/177
  See application file for complete search history.

(56) References Cited

U.S. PATENT DOCUMENTS

| | | | |
|---|---|---|---|
| 4,188,557 A | 2/1980 | Mattuschka | |
| 4,193,473 A | 3/1980 | Hartemann | |
| 4,985,655 A | 1/1991 | Jensik et al. | |
| 5,767,612 A | 6/1998 | Takeuchi et al. | |
| 6,049,158 A | 4/2000 | Takeuchi et al. | |
| 6,087,198 A | 7/2000 | Panasik | |
| 6,094,294 A | 7/2000 | Yokoyama et al. | |
| 6,548,942 B1 | 4/2003 | Panasik | |
| 6,842,088 B2 | 1/2005 | Yamakawa et al. | |
| 7,067,964 B1 | 6/2006 | Kosinski | |
| 7,418,772 B2 | 9/2008 | Nishiyama et al. | |
| 7,621,624 B2 | 11/2009 | Pan et al. | |
| 7,675,389 B2 | 3/2010 | Yamakawa et al. | |
| 7,714,684 B2 | 5/2010 | Ruby et al. | |
| 7,786,826 B2 | 8/2010 | Thalhammer et al. | |
| 7,812,502 B2 | 10/2010 | Zalalutdinov et al. | |
| 7,893,597 B2 | 2/2011 | Nishimura et al. | |
| 7,939,987 B1 | 5/2011 | Solal et al. | |
| 8,215,171 B1 | 7/2012 | Smith et al. | |
| 8,456,257 B1 | 6/2013 | Fattinger | |

(Continued)

OTHER PUBLICATIONS

International Search Report for PCT/US2018/043612 dated Oct. 18, 2018.

(Continued)

*Primary Examiner* — Derek J Rosenau
(74) *Attorney, Agent, or Firm* — Michael A. Davis, Jr.; Charles A. Brill; Frank D. Cimino

(57) ABSTRACT

Bulk acoustic wave resonators having a phononic crystal acoustic mirror are disclosed. An example integrated circuit package includes a bulk acoustic wave (BAW) resonator including a phononic crystal acoustic mirror (PCAM), the PCAM including a first arrangement of a first plurality of members in a first region, and a second arrangement of a second plurality of members in a second region, the first arrangement different from the second arrangement.

20 Claims, 4 Drawing Sheets

(56) References Cited

U.S. PATENT DOCUMENTS

| | | |
|---|---|---|
| 8,941,286 B2 | 1/2015 | Ortiz et al. |
| 9,232,289 B2 | 1/2016 | Bahr et al. |
| 9,577,603 B2 | 2/2017 | Burak et al. |
| 9,663,346 B1 | 5/2017 | Bahr et al. |
| 9,673,376 B1 | 6/2017 | Krivokapic et al. |
| 9,876,483 B2 | 1/2018 | Ortiz et al. |
| 2004/0070313 A1 | 4/2004 | Furukawa et al. |
| 2005/0093656 A1 | 5/2005 | Larson, III et al. |
| 2006/0255696 A1 | 11/2006 | Sato |
| 2009/0295505 A1* | 12/2009 | Mohammadi ......... H01L 41/107 333/191 |
| 2013/0214879 A1 | 8/2013 | Gorisse et al. |
| 2014/0273881 A1 | 9/2014 | Tajic |

OTHER PUBLICATIONS

C.J. Wilson, "Vibration modes of AT-cut convex quartz resonators," J. Phys. D: Appl. Phys., vol. 7, 1974, 7 pages.

Adachi et al., "Investigation of Spurious Modes of Convex DT-Cut Quartz Crystal Resonators," Proc. 35th Annual Freq Control Symposium, USAERADCOM, Ft. Monmouth, NJ, May 1981, 8 pages.

Lin et al., "Quality Factor Enhancement in Lamb Wave Resonators Utilizing Aln Plates with Convex Edges," IEEE, Trasducers '11, Beijing, China, Jun. 5-9, 2011, 4 pages.

Bahr et al., "Theory and Design of Phononic Crystals for Unreleased CMOS-MEMS Resonant Body Transistors," Journal of Microelectromechanical Systems, vol. 24, No. 5, Oct. 2015, 14 pages.

Bahr, "Monolithically Integrated MEMS Resonators and Oscillators in Standard IC Technology," Doctoral Thesis, Massachusetts Institute of Technology, May 18, 2016, 255 pages.

Bahr et al., "Vertical Acoustic Confinement for High-Q Fully-Differential CMOS-RBTS," Solid-State Sensors, Actuators and Microsystems Workshop, Hilton Head), 2016, 4 pages.

Bahr et al., "Optimization of Unreleased CMOS-MEMS RBTs," Frequency Control Symposium (IFCS), 2016 IEEE International, 4 pages.

Wang et al., "Tapered Phononic Crystal Saw Resonator in GAN," MEMS 2015, Estoril, Portugal, Jan. 18-22, 2015, IEEE, 4 pages.

Wang et al., "Resonant Body Transistors in Standard CMOS Technology," Oct. 2012, 7 pages.

Gorishnyy et al., "Sound ideas," Physics World, Dec. 2005, 6 pages.

\* cited by examiner ably need high-frequency, and high quality factor (Q) resonators. Q is a dimensionless parameter that reflects the under-damping of an oscillator, and characterizes a resonator's bandwidth relative to its center frequency. The Q of known BAW resonators are 10 to 100 times lower than the intrinsic limitations of the piezoelectric material. To improve the performance of BAW resonators, example BAW resonators including a phononic crystal (PnC) acoustic mirror (PCAM) are disclosed herein. Because disclosed example PCAMs confine the propagation of acoustic energy, more acoustic energy is retained in the active region of the BAW resonator. The increase in retained acoustic energy increases the Q of the BAW resonator, and, in turn, the performance of a system including the BAW resonator.

BULK ACOUSTIC WAVE RESONATORS HAVING A PHONONIC CRYSTAL ACOUSTIC MIRROR

FIELD OF THE DISCLOSURE

This disclosure relates generally to bulk acoustic wave (BAW) resonators, and, more particularly, to BAW resonators having a phononic crystal (PnC) acoustic mirror (PCAM).

BACKGROUND

In BAW resonators, electrodes (e.g., contacts, metal patches, etc.) on top and bottom surfaces of a layer of piezoelectric material excite acoustic waves in the piezoelectric material. Bulk acoustic waves of specific frequencies are generated within a resonant cavity forming a resonant response.

SUMMARY

Bulk acoustic wave resonators having a phononic crystal acoustic mirror are disclosed. An example integrated circuit package includes a bulk acoustic wave (BAW) resonator including a phononic crystal acoustic mirror (PCAM), the PCAM including a first arrangement of a first plurality of members in a first region, and a second arrangement of a second plurality of members in a second region, the first arrangement different from the second arrangement.

Figure 1:
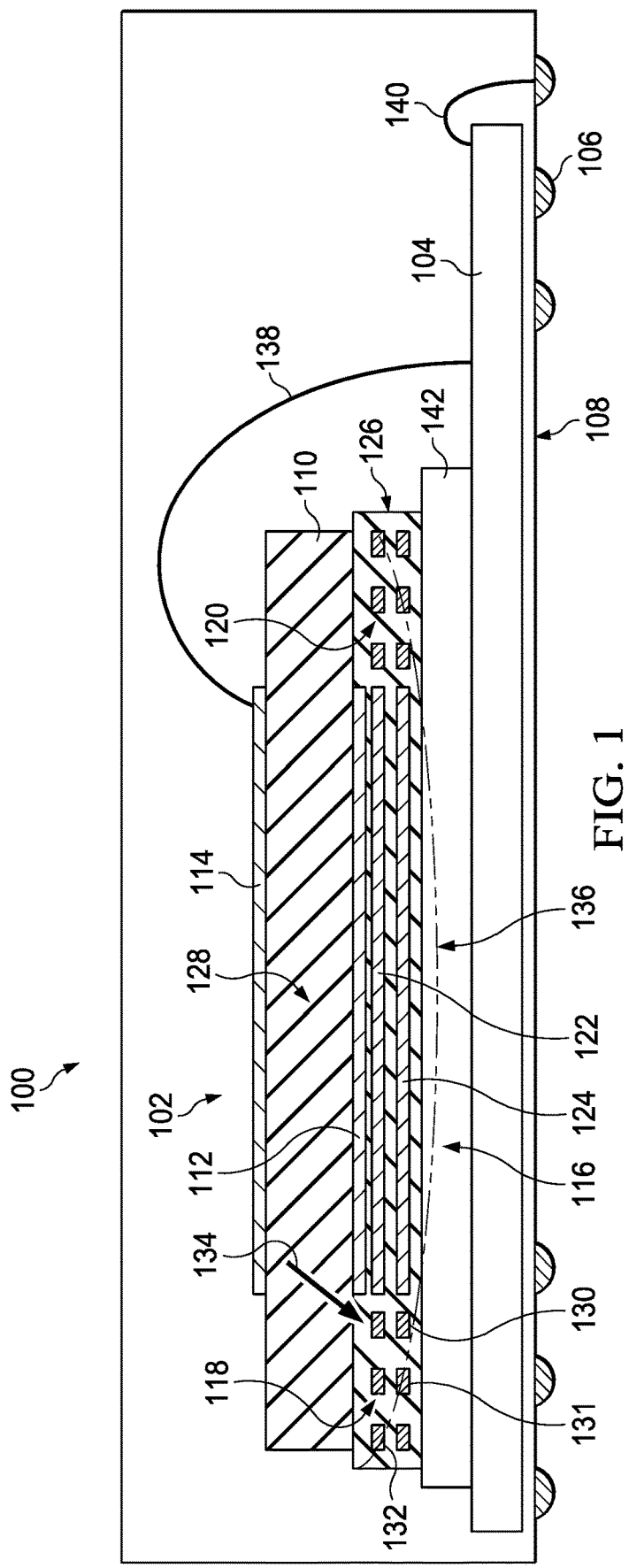
FIG. 1 is a side cross-section view of an example IC package including an example BAW resonator having an example PCAM, constructed according to this disclosure.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, deposited on, etc.) another part, indicates that the referenced part is either in contact with the other part, or that the referenced part is above the other part with one or more intermediate part(s) located therebetween. Stating that any part is in contact with another part means that there is no intermediate part between the two parts. Use of terms such as up, down, top, bottom, side, end, front, back, etc. herein are used with reference to a currently considered or illustrated orientation. If a different orientation is considered, it should be understood that such terms must be correspondingly modified. Connecting lines or connectors shown in the various figures presented are intended to represent example functional relationships and/or physical or logical couplings between the various elements.

DETAILED DESCRIPTION

Reference will now be made in detail to non-limiting examples of this disclosure, which are illustrated in the accompanying drawings. The examples are described below by referring to the drawings.

The performance of electrical devices, such as modern wireless communication devices, depends heavily on the accuracy and noise level of the clock signals used in a system. Such systems necess- FIG. 1 is a side cross-section view of an example IC package 100 (e.g., a semiconductor-based device, chip, etc.) having an example BAW resonator 102 disposed in the example IC package 100. The example IC package 100 of FIG. 1 is a surface mount device with a plurality of contacts (an example of which is designated at reference numeral 106) on a bottom side 108. However, the example IC package 100 may be of any type, and may have any form, material(s), shape, dimension(s), number of contacts, shape of contacts, etc. In some examples, the IC package 100 is a wafer-level package, or a die-level package. The BAW resonator 102 and/or any other components may be integrated, etc. with other circuits (e.g., an example IC 104) and/or passive components, or by itself, and packaged in an IC package (e.g., the example IC package 100) in any way. Example ICs 104 include, but are not limited to, a digital logic circuit, an analog circuit, a processor core, a digital signal processor (DSP) core, etc.

The example BAW resonator 102 of FIG. 1 includes a layer of piezoelectric material 110 disposed on (e.g., deposited on, formed on, etc.) an example bottom electrode 112, and an example top electrode 114 disposed on (e.g., deposited on, formed on, etc.) the layer of piezoelectric material 110 opposite the bottom electrode 112. In operation, when a voltage is applied between the top electrode 114 and the bottom electrode 112, bulk acoustic waves of specific frequencies are generated within the resonator stack (112, 110, 114), forming a resonance response. The resonant response may, for example, be used to generate a clock signal, a carrier signal, etc.

In the example of FIG. 1, the bottom electrode 112, the layer of piezoelectric material 110, and the top electrode 114 are planar structures, however, they may be formed to have other shapes. Moreover, the bottom electrode 112, the layer of piezoelectric material 110, and the top electrode 114 need not have the same dimensions or shape. In the case of a semiconductor-based IC package, the example layer of piezoelectric material 110 may include a piezoelectric material compatible with a semiconductor manufacturing process, such as aluminum nitride and zinc oxide. In some examples, the BAW resonator 102 is built on a sacrificial layer (the substrate will be released later) to form a free-standing thin-film resonator. In other examples, the BAW resonator 102 is built on one or more acoustic reflectors (Bragg reflectors) to form a solidly mounted resonator.

To increase retention of acoustic energy in the BAW resonator 102, the example BAW resonator 102 includes an example Bragg mirror 116 (a.k.a. an acoustic mirror, an acoustic reflector, etc.), an example PCAM 118, and an example PCAM 120. The example Bragg mirror 116 of FIG. 1 reduces acoustic energy leakage through the bottom of the BAW resonator 102. Any known or future Bragg mirror, acoustic mirror, acoustic reflector, etc. may be used to implement the Bragg mirror 116. The example Bragg mirror 116 of FIG. 1 includes alternating layers of materials with different acoustic impedance. In some examples, the Bragg mirror 116 includes flat metal members (e.g., membranes, layers, sheets, plates, etc.), two of which are designated at reference numerals 122 and 124, spaced apart and disposed in a dielectric material 126. The thickness(es) of and distances between the metal members 122, 124 are selected, based on an intended resonant frequency of the BAW resonator 102, to cause constructive interference at that frequency, resulting in the Bragg mirror 116 reducing spurious modes, and confining (e.g., reflecting, directing, containing, etc.) at least some main mode acoustic energy at that frequency in a resonant cavity portion 128 of the BAW 102. In some examples, confining main mode acoustic energy refers to confining a portion of main mode acoustic energy. Thus, retention of acoustic energy at the intended resonant frequency in the BAW resonator 102 is increased, and the Q of the BAW resonator 102 is increased, and, in turn, the performance of a system including the example BAW 102 and/or the example IC package 100. In the case of a semiconductor-based IC package, the example electrodes 112 and 114 are formed of a conductive material compatible with a CMOS manufacturing process. In some examples, the metal members 122, 124 include tungsten (W), titanium tungsten (TiW), or copper (Cu), and the dielectric material 126 includes silicon dioxide (SiO2), or a carbon doped oxide dielectric such as SiCOH. In some examples, the thickness of the members 122, 124 is one fourth the wavelength of a wave of interest in the material. For example, for a 5 GHz resonator, the wavelength of the p-wave is 1.02 μm for W, and 1.18 μm for SiO2, corresponding to respective thicknesses of 255 nm and 295 nm.

The example PCAM 118 of FIG. 1 reduces acoustic energy leakage through the left end of the BAW resonator 102, and the example PCAM 120 of FIG. 1 reduces acoustic energy leakage through the right end of the BAW resonator 102. The PCAM 118 extends laterally from the Bragg mirror 116 to the left, and the PCAM 120 extends laterally from the Bragg mirror 116 to the right. Because the PCAMs 118 and 120 (and other example PCAMs disclosed below) reduce acoustic energy leakage through their respective ends of the BAW resonator 102, the costly and complex processes needed to form a guard ring on the top electrode 114 for known BAW resonators can be eliminated. Because the example PCAM 120 is implemented similarly to the PCAM 118, the reader is referred to the description of the PCAM 118 for a description of the PCAM 120. The example PCAM 118 will now be described.

Figure 2:
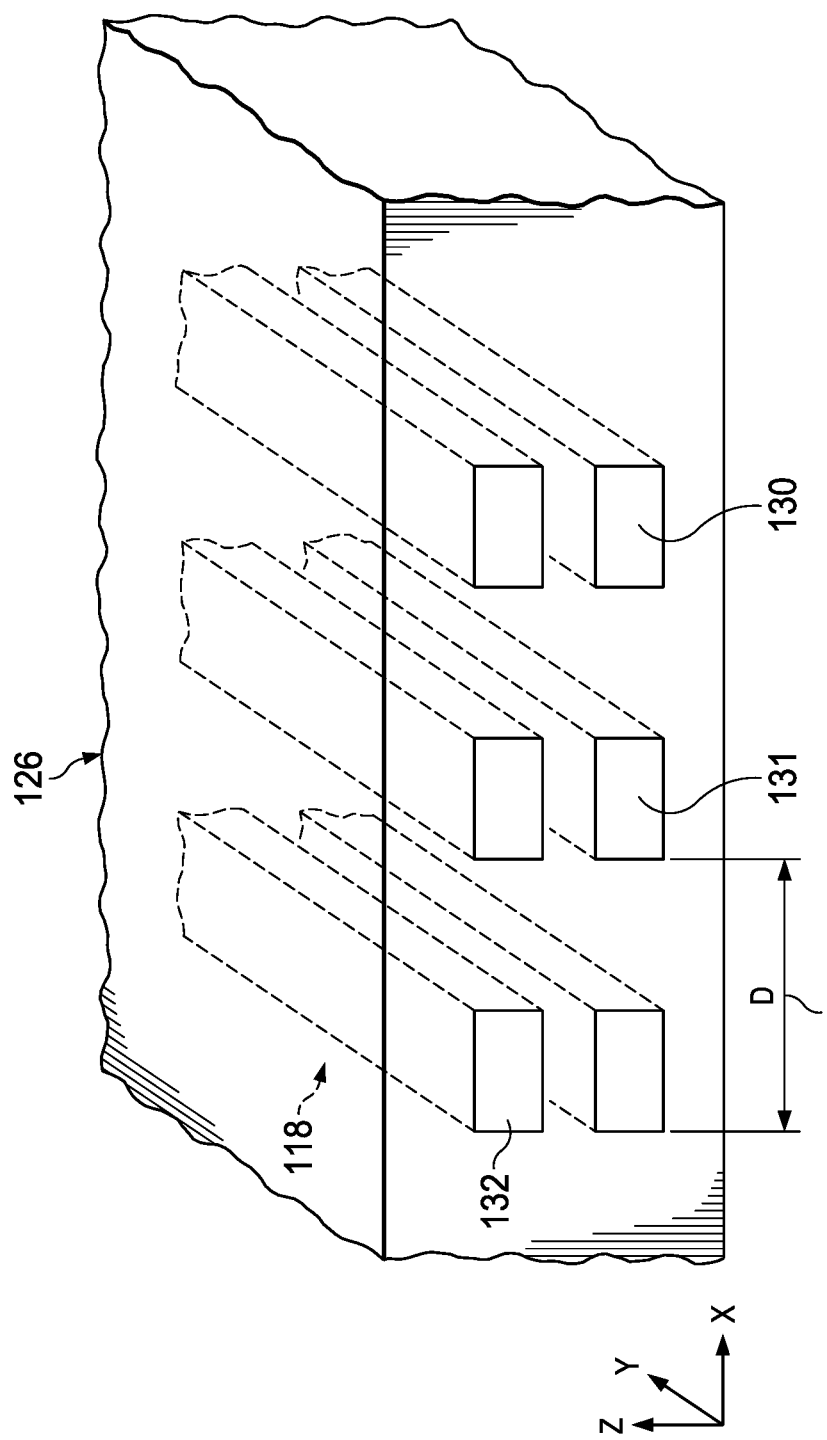
FIG. 2 is a perspective view of an example arrangement that may be used to implement the example PCAMs disclosed herein.

The example PCAM 118 includes an ordered arrangement of a plurality of members (three of which are designated at reference numerals 130, 131 and 132) to implement a desired (e.g., intended, designed, specified, etc.) pattern of variations in one or more acoustic properties. Example acoustic properties include, but are not limited to, Young's modulus, Poisson's ratio, density, and shear modulus. of the PCAM 118. As shown in FIG. 2, the example members 130-132 extend longitudinally into, and, in some example, through the dielectric material 126. In the example of FIGS. 1 and 2, the variations in acoustic properties of the PCAM 118 are two-dimensional (2D), occurring along the x-axis and the z-axis. However, a three-dimensional (3D) PCAM may be implemented when, for example, acoustic signal energy occurs along the y-axis. While rectangular shapes are shown in FIGS. 1 and 2, other shapes, such as cylinders, triangles, etc., may be implemented. Other arrangements, such as lattices, can be implemented. In some examples, the members 130-132 are replaced with hollow areas (e.g., regions, portions, etc.) of the dielectric material 126. For example, each of the members 130-132 of FIGS. 1 and 2 could be replaced with a hollow cylindrical area that passes at least part way through the dielectric material 126.

The dimension(es) of and distance(s) (one of which is designated at reference numeral 133) between the members 130-132 are selected using, for example, Bloch's Theorem, or known or future methods developed based on Bloch's Theorem. The dimension(es) of and distance(s) are selected, based on an intended resonant frequency of the BAW resonator 102 and potential angle of acoustic energy leakage, to form phononic band gaps that prevent acoustic signals at the intended resonant frequency from passing through PCAM 118. Thus, retention of acoustic energy at the intended resonant frequency in the BAW resonator 102 is increased, and the Q of the BAW resonator 102 is increased.

In some examples, the PCAM 118 and the PCAM 120 are designed to confine at least some main mode acoustic energy that is emitted from the BAW 102 on angles (one of which is designated at reference numeral 134). In some examples, the example Bragg mirror 116 implements a one-dimensional (1D) PCAM formed by an arrangement of a plurality of members (the members 122 and 124)) to implement a desired pattern of variations in one or more acoustic properties (e.g., reflect acoustic energy at a desired frequency). The PCAM 118 and the PCAM 120 have different arrangements of members than the Bragg mirror 116, and, thus, implement different variations in acoustic properties. The example Bragg mirror 116 confines at least some main mode acoustic energy that is emitted downward from the BAW 102. By implementing the BAW 102 with the Bragg mirror 116 (e.g., parallel horizontal flat members 122, 124), the PCAM 118 (e.g., 2D arrangement of elongated members 130-132) and PCAM 120, which have different arrangements of members, a virtual reflector 136 is implemented. The virtual reflector 136, at least in part, reduces spurious modes, and confines main mode acoustic energy in the resonant cavity portion 128 of the BAW resonator 102 for a wider range of angles (e.g., more than just downward) than is realized in known acoustic resonators.

In some examples, the members 130-132 of the PCAMs 118 and 120 (and those of additional example PCAMs disclosed below) are used to implement feature dummies used during a chemical-mechanical polishing (CMP) process to reduce the likelihood of recesses forming in a surface during polishing. Because the members 130-132 are already included to reduce acoustic leakage, their additional use as CMP feature dummies obviates the complexity and cost of implementing conventional CMP feature dummies. The use of CMP enables a flatter piezoelectric layer, which, in turn, reduces scattering and spurious emissions. A flatter piezoelectric layer 110 can allow thicker layers (e.g., the piezoelectric layer 110) to be formed, thereby allowing lower resonant frequencies without necessarily introducing steps, coverage and/or cracking issues at the edges.

The bottom electrode 112 and the top electrode 114 may be electrically coupled with other components in the IC package 100 (e.g., the example IC 104) and/or external components. For example, the top electrode 112 may be electrically connected wire bonded (shown schematically by a line 138 in FIG. 1) to the example IC 104 implemented in the IC package 100. In some examples, the IC 104 controls and/or uses a clock signal generated using the BAW resonator 102 to perform one or more functions (e.g., down conversion, up conversion, modulation, de-modulation, etc.). The IC 104, the bottom electrode 112 and/or the top electrode 114 may be electrically coupled (connected etc.) to an external contact (e.g., the example contact 106), as shown schematically in FIG. 1 with a line 140. In the example of FIG. 1, the BAW resonator 102 is disposed on (e.g., deposited on, formed on, etc.) an example substrate 142, an acoustic reflector, a sacrificial layer, etc. In some examples, the IC 104 is an IC die, and the BAW resonator 102 is a microelectromechanical system (MEMS) die.

Figure 3:
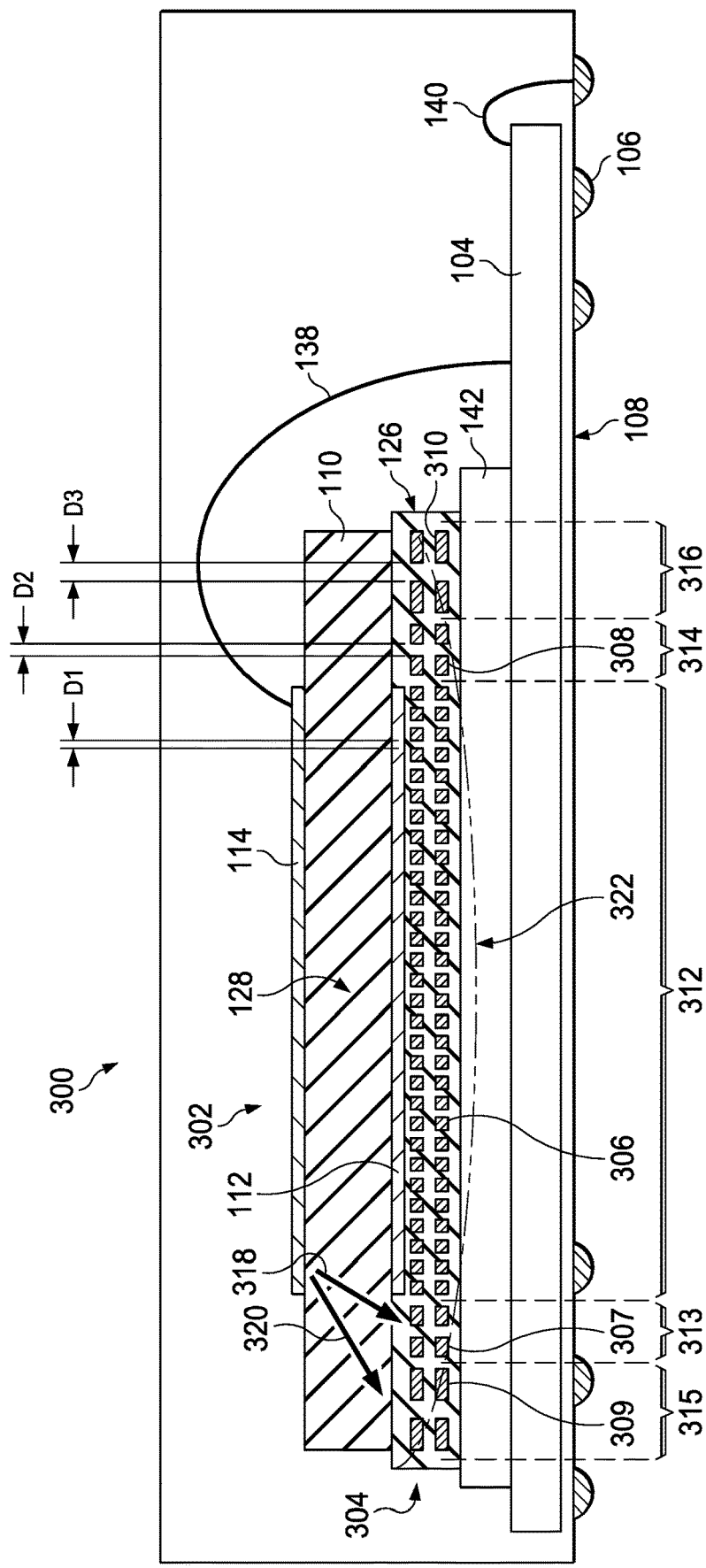
FIG. 3 is a side cross-section view of another example IC package including an example BAW resonator having another PCAM, constructed according to this disclosure.

FIG. 3 is a side cross-section view of another example IC package 300 having a BAW resonator 302 including another example PCAM 304, in accordance with this disclosure. Identical parts, structures, arrangements, etc. shown in FIG. 1 and FIG. 3 have the same reference numbers in FIGS. 1 and 3. The accompanying written descriptions are not repeated here. Instead, the reader is referred to the written descriptions provided above in connections with FIG. 1 for these identical parts, structures, arrangements, etc.

In the example of FIG. 3, the Bragg mirror 116, the PCAM 118 and the PCAM 120 of FIG. 1 are replaced by the example multiple region PCAM 304. The example multi-region PCAM 304 of FIG. 3 reduces acoustic energy leakage through the bottom, the left end, and the right end of the BAW resonator 302. The example PCAM 304 of FIG. 3 includes a plurality of members (five of which are designated at reference numerals 306, 307, 308, 309 and 310) that are arranged in an ordered pattern. The ordered pattern of the members 306-310 implements an ordered pattern of variations in the acoustic properties of the PCAM 304. Like that shown in FIG. 2, the members 306-310 extend longitudinally into the dielectric material 126. In the example of FIG. 3, the variations in acoustic properties of the PCAM 304 are two-dimensional (2D), occurring along the x-axis and the z-axis. However, a three-dimensional (3D) PCAM may be implemented when, for example, acoustic signal energy occurs along the y-axis. While rectangular shapes are shown in FIG. 3, other shapes, such as cylinders, triangles, etc., may be implemented. Other arrangements, such as lattices, can be implemented. In some examples, the members 306-310 are replaced with hollow areas (e.g., regions, portions, etc.) of the dielectric material 126. For example, each of the members 306-310 could be replaced with a hollow cylindrical area that passes at least part way through the dielectric material 126.

The example multi-region PCAM 304 of FIG. 3 includes five example regions 312, 313, 314, 315 and 316. As shown, each of the regions 312-316 includes one or more of the plurality of the members 306-310. As shown, the regions 312-316 can have a different number of regions, a different number of members, different shaped members, members of different sizes, different distances between members, different arrangements of members, etc. In some examples, the regions 312-316 are implemented to reduce acoustic energy leakage of different modes (longitudinal, shear modes etc.) at different angles for different portions of the BAW resonator 302. For example, acoustic energy leaking downward in a middle portion of the BAW resonator 302, and increasingly becoming more horizontal as the distance from the end of the bottom electrode 112 increases. In an example, to reduce acoustic energy leakage through the bottom of the BAW resonator 302, the example region 312 includes members (one of which is designated at reference numeral 306) that are selected and arranged (e.g., smaller and spaced closer together by a distance D1) to block acoustic energy that is mainly perpendicular to the region 306. To reduce acoustic energy leakage on a downward and outward direction 318 from the BAW resonator 302, the example region 313 includes members (one of which is designated at reference numeral 307) that are selected and arranged (e.g., larger and spaced further apart by a larger distance D2) to block acoustic energy that impinges the region 313 at the angles 318. To reduce acoustic energy leakage on a shallower outward direction 320 from the BAW resonator 302, the example region 315 includes members (one of which is designated at reference numeral 309) that are selected and arranged (e.g., even larger and spaced even further apart by a larger distance D3) to block acoustic energy that impinges the regions 315 at a shallower angle 320. By implementing the PCAM with different regions 312-316 have different arrangements of members, a virtual reflector 322 is implemented. The virtual reflector 322, at least in part, reduces spurious modes, and confines main mode acoustic energy in a resonant cavity portion of the BAW resonator 302 for a wider range of angles (e.g., more than just downward) than is realized in known acoustic resonators.

As explained above, the dimension(es) and arrangement(s) of the members 306-310 for the regions 312-316 can be selected based on Bloch's Theorem, an intended resonant frequency of the BAW resonator 302, and an anticipated angle of acoustic energy leakage, to form phononic band gaps that increase retention of acoustic energy at the intended resonant frequency in the BAW resonator 302, and the Q of the BAW resonator 302 is increased.

Figure 4:
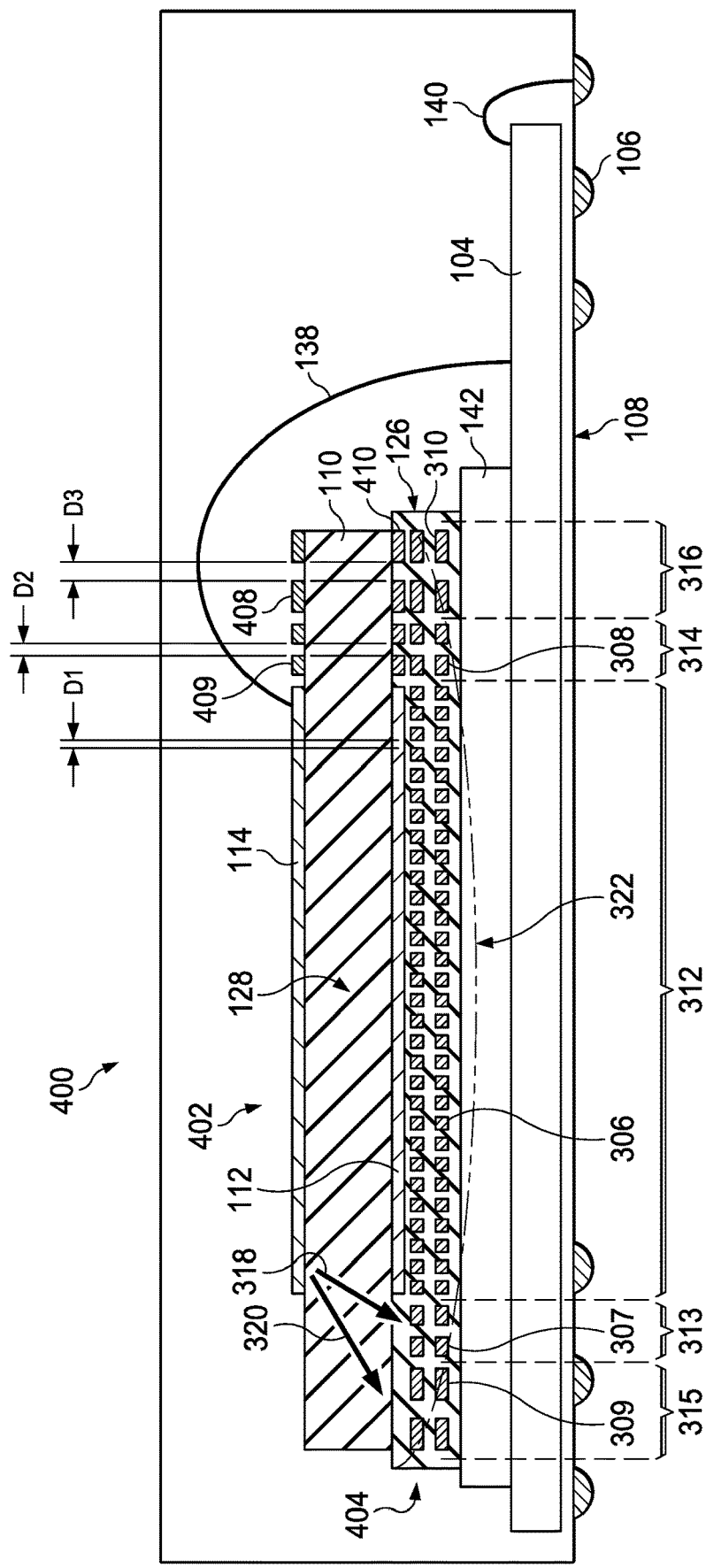
FIG. 4 is a side cross-section view of yet another example IC package including an example BAW resonator having yet another example PCAM, constructed according to this disclosure.

FIG. 4 is a side cross-section view of another example IC package 400 having a BAW resonator 402 including yet another example PCAM 404, in accordance with this disclosure. Identical parts, structures, arrangements, etc. shown in FIG. 1, FIG. 3 and FIG. 4 have the same reference numbers in FIGS. 1, 3 and 4. The accompanying written descriptions are not repeated here. Instead, the reader is referred to the written descriptions provided above in connections with FIGS. 1 and 3 for these identical parts, structures, arrangements, etc.

In the example FIG. 4, the example multi-region PCAM 404 extends the example multi-region PCAM 304 of FIG. 3 with additional members (three of which are designated at reference numerals 408, 409 and 410). A portion of the additional members 408-410 are on the same layer of the BAW resonator 402 as the bottom electrode 112, and another portion are on the same layer of the BAW resonator 402 as the top electrode 114. In some examples, additional members 408-410 are shaped and dimensioned to correspond to the member 306-310 below the additional member 408-410. The additional members 408-410 may be implemented on one end of the BAW resonator 402, as shown, or both ends. In some examples, the members 408-410 are formed of the same materials as the electrodes 112 and 114, and formed (e.g., deposited) at the same time that the electrodes 112 and 114 are formed. They can also be formed of the same material as the members 306-310. The members 408-410 can be selected and arranged together with the members 306-310 based on Bloch's Theorem, an intended resonant frequency of the BAW resonator 402, and an anticipated angle of acoustic energy leakage, to form phononic band gaps that increase retention of acoustic energy at the intended resonant frequency in the BAW resonator 402, and the Q of the BAW resonator 402 is increased.

While example manners of implementing example IC packages 100, 300, and 400 including a BAW resonator 102, 302, 402 having a PCAM, in accordance with this disclosure, are illustrated in FIGS. 1-4, one or more of the parts, structures, arrangements, etc. illustrated in FIGS. 1-4 may be combined, divided, re-arranged, omitted, eliminated and/or implemented in any other way. Further, an IC package including a BAW resonator having a PCAM in accordance with this disclosure may include one or more parts, structures, arrangements, etc. in addition to, and/or instead of, those illustrated in FIGS. 1-4, and/or may include more than one of any or all of the illustrated parts.

"Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended. Conjunctions such as "and," "or," and "and/or" are inclusive unless the context clearly dictates otherwise. For example, "A and/or B" includes A alone, B alone, and A with B. In this specification and the appended claims, the singular forms "a," "an" and "the" do not exclude the plural reference unless the context clearly dictates otherwise.

Any references, including publications, patent applications, and patents, cited herein are hereby incorporated by reference to the same extent as if each reference were individually and specifically indicated to be incorporated by reference and were set forth in its entirety herein.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An integrated circuit package comprising:
  a bulk acoustic wave (BAW) resonator including a phononic crystal acoustic mirror (PCAM), the PCAM including a first arrangement of a first plurality of members in a first region, and a second arrangement of a second plurality of members in a second region, the first arrangement different from the second arrangement.

2. The integrated circuit package of claim 1, wherein the PCAM reduces leakage of acoustic energy from the BAW resonator.

3. The integrated circuit package of claim 1, wherein the first region confines acoustic energy in a first direction, and the second region confines acoustic energy in a second direction, the second direction different than the first direction.

4. The integrated circuit package of claim 1, wherein the PCAM at least partially confines acoustic energy in the BAW resonator.

5. The integrated circuit package of claim 1, wherein the first arrangement of the first plurality of members implements first acoustic property variations, and the second arrangement of the second plurality of members implements second acoustic property variations, the second acoustic property variations different from the first acoustic property variations.

6. The integrated circuit package of claim 1, wherein the first arrangement includes a periodic arrangement of the first plurality of members.

7. The integrated circuit package of claim 1, wherein the first arrangement includes an acoustic reflector.

8. The integrated circuit package of claim 1, wherein the PCAM includes a member on a layer of the BAW resonator including an electrode of the BAW resonator.

9. The integrated circuit package of claim 1, the BAW resonator including:
  a substrate;
  dielectric material disposed on the substrate, at least a portion of the PCAM implemented in the dielectric material;
  a first electrode disposed on the dielectric material;
  piezoelectric material disposed on the first electrode; and
  a second electrode disposed on the piezoelectric material opposite the first electrode.

10. The integrated circuit package of claim 9, the BAW resonator further including a flat metal member in the dielectric material to implement an acoustic reflector, the flat metal member below the first electrode, the PCAM extending laterally from the flat metal member underneath the piezoelectric material.

11. The integrated circuit package of claim 9, wherein the PCAM extends underneath the first electrode and the piezoelectric material.

12. The integrated circuit package of claim 9, wherein the piezoelectric material includes a thin film including at least one of aluminum nitride or zinc oxide, the dielectric material includes at least one of SiO2 or SiCOH, and a member of the first plurality of members includes at least one of tungsten (W), titanium tungsten (TiW), or copper (Cu).

13. A bulk acoustic wave (BAW) resonator comprising:
  dielectric material;
  a multi-region phononic crystal (PnC) acoustic mirror implemented in the dielectric material to reduce leakage of acoustic energy from the BAW;
  a first electrode disposed on the dielectric material above the PnC acoustic mirror;
  piezoelectric material disposed on the first electrode; and
  a second electrode disposed on the piezoelectric material opposite the first electrode.

14. The BAW resonator of claim 13, wherein a first region of the PnC includes a first arrangement of a first plurality of members, and a second region of the PnC includes a second arrangement of a first second of members, the first arrangement different than the second arrangement.

15. The BAW resonator of claim 13, wherein a first region of the PnC acoustic mirror includes at least one of a Bragg reflector, an acoustic reflector or a dielectric mirror.

16. The BAW resonator of claim 15, further including a flat metal member in the dielectric material to implement the least one of a Bragg reflector, an acoustic reflector or a acoustic mirror, the flat metal member extending underneath the first electrode, the PnC acoustic mirror extending laterally from the flat metal member underneath the piezoelectric material.

17. The BAW resonator of claim 13, wherein a first portion of the plurality of members is arranged differently in a first region of the PnC acoustic mirror than a second portion of the plurality of members in a second region of the PnC acoustic mirror.

18. The BAW resonator of claim 15, wherein acoustic property variations of the PnC acoustic mirror differ between regions of the PnC acoustic mirror.

19. The BAW resonator of claim 13, wherein the PnC acoustic mirror extends underneath the first electrode and the piezoelectric material.

20. The BAW resonator of claim 13, wherein the piezoelectric material includes a thin film including at least one of aluminum nitride or zinc oxide, the dielectric material includes at least one of SiO2 or SiCOH, and the flat metal member includes at least one of tungsten (W), titanium tungsten (TiW), or copper (Cu).

* * * * *